United States Patent [19]
Anders et al.

[11] Patent Number: 6,137,231
[45] Date of Patent: Oct. 24, 2000

[54] CONSTRICTED GLOW DISCHARGE PLASMA SOURCE

[75] Inventors: Andre Anders; Simone Anders, both of Albany; Michael Dickinson, San Leandro; Michael Rubin, Berkeley, all of Calif.; Nathan Newman, Winnetka, Ill.

[73] Assignee: The Regents of the University of California, Oakland, Calif.

[21] Appl. No.: 08/711,844

[22] Filed: Sep. 10, 1996

[51] Int. Cl.$^7$ ....................................................... H05H 1/24
[52] U.S. Cl. ................................ 315/111.21; 315/111.31; 315/111.41; 313/231.41; 118/723 E
[58] Field of Search .......................... 315/111.21, 111.41, 315/111.31; 118/723 E, 723 ER; 313/231.41; 219/121.47

[56] References Cited

U.S. PATENT DOCUMENTS

| | | | |
|---|---|---|---|
| 4,980,196 | 12/1990 | Yasuda et al. | 427/38 |
| 5,037,522 | 8/1991 | Vergason | 204/298.41 |
| 5,039,376 | 8/1991 | Zukotynski et al. | 118/723 E X |
| 5,110,437 | 5/1992 | Yamada et al. | 118/723 E X |
| 5,330,800 | 7/1994 | Schumacher et al. | 427/523 |
| 5,552,675 | 9/1996 | Lemelson | 315/111.21 |
| 5,804,089 | 9/1998 | Suzuki et al. | 118/723 E X |

FOREIGN PATENT DOCUMENTS

| | | | |
|---|---|---|---|
| 61-214426 | 9/1986 | Japan | 118/723 E |
| 4-363898 | 12/1992 | Japan | 315/111.21 |

OTHER PUBLICATIONS

Anders, A., et al; "Hollow–anode plasma source for molecular beam epitaxy of gallium nitride"; Rev. Sci. Instrum. 67 (3), Mar. 1996, pp 905–907.

Anders, A., and Anders, S.; "The working principle of the hollow–anode plasma source"; Plasma Source Sci. Technol. 4 (Nov. 1995); pp 571–575.

Miljevic, V. I.; "Some Characteristics of the hollow–anode ion source"; Rev. Sci. Instrum. 63 (4); Apr. 1992; pp 2619–2620.

Miljevic, V. I.; "Hollow anode ion source"; Rev. Sci. Instrum. 61 (1), Jan. 1990; pp 312–314.

Miljevic, V.; "Hollow anode ion–electron source"; Rev. Sci. Instrum. 55 (6), Jun. 1984; pp 931–933.

Miljevic, V. I.; "Spectroscopy of hollow anode discharge"; Applied Optics, vol. 23, No. 10, May 15, 1984; pp 1598–1600.

*Primary Examiner*—Justin P. Bettendorf
*Attorney, Agent, or Firm*—Janis Biksa; Henry P. Sartorio

[57] ABSTRACT

A constricted glow discharge chamber and method are disclosed. The polarity and geometry of the constricted glow discharge plasma source is set so that the contamination and energy of the ions discharged from the source are minimized. The several sources can be mounted in parallel and in series to provide a sustained ultra low source of ions in a plasma with contamination below practical detection limits. The source is suitable for applying films of nitrides such as gallium nitride and oxides such as tungsten oxide and for enriching other substances in material surfaces such as oxygen and water vapor, which are difficult process as plasma in any known devices and methods. The source can also be used to assist the deposition of films such as metal films by providing low-energy ions such as argon ions.

20 Claims, 5 Drawing Sheets

CONSTRICTED GLOW DISCHARGE PLASMA SOURCE

FIELD OF THE INVENTION

This invention relates to structures and methods for producing a streaming plasma with a very low level of contamination and low energy ions in a vacuum processing chamber, e.g., such as in those used to process semiconductors, to synthesize thin films on the surface of a substrate.

BACKGROUND OF THE INVENTION

In a vacuum processing chamber ion sources are used to change the properties of substrate surfaces. Gas is fed through an electric field in a vacuum chamber to excite the gas to a plasma state. The energized ions of gas constituents bombard the surface of the substrate. The effect that the ions have on the surface is dependent on their atomic constituents and their energy.

Low-energy, ultra-clean flows of plasmas are required, to obtain a crystalline film with high crystal quality as required in the case of gallium nitride (GaN). To avoid ion damage the ion energy must not be too high, for instance, an ion with a kinetic energy of 20 or more eV for GaN must be considered a high energy ion. When an ion hits the surface during crystalline film growth and its kinetic energy is high enough to displace atoms which are already in place, a defect is created. So the materials grown with energetic plasma streams tend to have lots of defects. The defects create "carrier" densities for semiconductors such as GaN, leading to the creation of a material with n-type doped properties. In these cases it is difficult to obtain a p-type doped material. To overcome this problem a source of low energy ions is needed.

A nitrogen plasma flow or low-energy ion beam (ion energy of order 30–50 eV) is usually obtained by using a Kaufman ion source or an Electron-Cyclotron-Resonance (ECR) plasma source.

The drawback of a Kaufman source is that a hot tungsten filament is used as a cathode. The tungsten filament delivers large quantities of electrons by thermionic emission, which sustain the low-energy non-self-sustained arc discharge, but tungsten atoms evaporate from the filament and can be found in the stream of plasma and the growing films. This is not acceptable for instance in the growth of GaN because the stream is not clean and the film properties are altered by the impurities.

An ECR plasma source necessarily operates with a high magnetic field to fulfill the resonance condition of microwave frequency and electron cyclotron frequency. Typically, the standard microwave frequency of 2.45 GHz is used, leading to a required magnetic field of 875 Gauss. The gaseous microwave plasma is produced in the region of the resonance magnetic field. The ions gain kinetic energy when leaving the location of the high magnetic field and streaming towards the substrate. When a plasma is made this way there is a significant energetic component in the ion energy distribution, i.e., ions having 30–50 eV of kinetic energy are abundant. This energy is too high for the growth of a high quality crystalline films. Although ECR plasma sources are cleaner than Kaufman sources, ion damage is observed in growing films due to the relatively high ion energy. One way to overcome this energy problem is to bias the substrate electrically, to deflect the energetic ions but in doing so the low energy ions are also deflected and the growth rate decreases.

A better (cleaner) source of low-energy gaseous ions is needed to deposit high quality thin films on substrates in both research and commercial applications. This need includes not only MBE-type but also IBAD-type deposition of thin films (MBE=molecular beam epitaxy; that is film growth with reactive, activated gases; IBAD=ion beam assisted deposition, that is film growth assisted by the moderate kinetic energy of ions such as argon).

A plasma discharge chamber usable for an ion beam source, electron beam source, and a spectral light source was introduced by V. I. Miljevic and is described in several papers (Rev. Sci. Instrum. 55 (1984) 931; Rev. Sci. Instrum 63 (1992) 2619) (also see U.S. Pat. Nos. 4,871,918; 4,906,890). A preliminary explanation of the working principle of the discharge is given in a paper published in *Plasma Sources Science & Technology*, Vol. 4. (1995) p.571.

In one configuration as shown in FIG. 1, a gas flows through a discharge chamber 20 which consists of a metal cathode 22 (grounded) and a metal anode 24 (positively biased) separated by a TEFLON (e.g., PTFE) insulator 26. A flange 28 holds the anode 24 in place and seals it against the cathode flange using a series of O-rings 30. By applying a sufficiently high voltage (500 V or more) to the electrodes, a glow discharge ignites in the flowing gas. The gas is introduced through an opening 40 in the cathode, and leaves the source through a small aperture 38 in the anode. A high positive voltage is applied to an extraction electrode 32 leading to acceleration of the ions from the source 20 in the direction shown by arrow 36. A high negative voltage would accelerate electrons, turning the source into an electron beam source. An electromagnetic coil 34 produces a magnetic field around the anode 24 focusing the ions in an ion beam (whose direction is shown by the arrow 36) departing from the discharge opening 38 in the anode 24. Gas pressure supplied to the gas inlet 40 provides the motive force to discharge the ions from the discharge chamber 20. The extraction electrode 32 and magnetic coil 34 assist in accelerating and focusing the ion discharge into a beam. The anode 24 is insulated from the grounded cathode 22 and grounded support flange 28 by a thin film of ceramic coating deposited on the respective mating surfaces of the anode 24.

The feature which distinguishes this kind of discharge from an ordinary glow discharge is the actual exposure of a very small area of a large cross section anode facing the cathode, to the gas. In the Miljevic configuration this effect is obtained by blocking nearly all of the anode 24 by using an insulator 26, except for a small discharge aperture. This discharge aperture forms a small hollow anode, and Miljevic named the discharge "hollow-anode discharge". We have found (*Plasma Sources Science & Technology*, Vol. 4. (1995) p.571.) that a voltage drop appears in front of the discharge opening, accelerating electrons which gain enough energy to ionize the working gas through inelastic collisions. A bright "anode plasma" forms in the anode channel, and this plasma is blown out by the gas flow in the channel due to the pressure gradient between the inside and the outside of the source. The "anode plasma" does not form when there is no blocking or covering such a large anode.

SUMMARY OF THE INVENTION

A structure and method according to the invention involves using a special type of glow discharge plasma source, namely the so-called "Constricted Glow Discharge Plasma Source". The configuration of the prior art plasma source is adapted in a way that it delivers a downstream gaseous plasma of extremely low contamination and very low kinetic energy, well-suited for the growth of high-quality thin films. The source can operate in a wide range of parameters, in particular it can also work at very low and very high gas pressures. We have found that the anode does not necessarily need to form a small opening which is located next to the blocking insulator. The "hollow anode discharge" is just one possible configuration which makes use of a constriction element. The invention describes a special type of glow discharge characterized by a constriction between cathode and anode. We named this type "constricted glow discharge", and the derived downstream plasma source "constricted glow discharge plasma source".

The constricted glow discharge plasma source includes a discharge chamber where the potential of the cathode is below that of the anode, and the potential of the anode is approximately the same as the potential of the substrate being processed, thereby minimizing the energy of ions reaching the substrate. Having the substrate and anode at substantially the same potential, eliminates the accelerative effect on ions or electrons that a biased substrate would experience. The configuration and method according to the invention provides a simple construction and operation of a low energy plasma source.

The source is simple, compact, and versatile. It can be used with a large number of surface modification techniques and thin film synthesis methods. Synthesis implies that some sort of chemical reaction occurs while depositing plasma constituents. A few applications which are already known include:

Growth of high-quality GaN thin films. GaN is a wide bandgap semiconductor with a number of applications such as blue light-emitting diodes, flat panel displays, and high temperature electronics applications. The constricted glow discharge plasma source has been shown to be a key element in achieving the required film quality by an MBE-type growth.

Gas streams in all versions of the source are fed to the discharge chamber. The electric field there causes the gas to become partially ionized and leaves the source through a constriction element located upstream the anode.

The streaming plasma contains only low-energy ions (lower than 20 eV) because (1) the anode is positive, therefore attracting electrons but decelerating ions, and (2) a relatively dense, collisional plasma is formed in the upstream vicinity of the constriction element, in which energetic ions and neutral atoms lose their energy by collisions. The requirements of low ion energy (a few eV or less) for GaN film growth is therefore fulfilled.

The plasma stream from the source is clean because (1) no filament or other hot parts are used, (2) material sputtered by the ion bombardment from the cathode is—with a very high probability—deposited inside the discharge chamber since the output aperture of the constriction element is very small, (3) the source can be built of material tolerable or desirable to the specific application. For instance, we have built a source where all plasma-facing components are made of high-purity aluminum (electrodes) and high-purity aluminum nitride ceramics (insulator parts).

Such a source makes growth of high-quality thin films, such as GaN, possible.

It has been found that cathodes made from titanium show excellent long term stability when operating with nitrogen. A TiN film is formed on the surface of the cathode as a result of a chemical reaction of the cathode with the activated plasma nitrogen. Titanium nitride is sufficiently conductive to sustain the cathode function, but does not form an electrically insulating film as AlN eventually does.

Similarly, stainless steel (e.g., SS 304L) has also been used successfully as a cathode with oxygen because it does not form an insulating oxide film.

In general, a criterion for the selection of a cathode material for a given gas is that this material, if it reacts chemically with the gas, does not form an insulating film on the cathode surface. However, it may well form a conducting film.

An optimization of the configuration according to the invention, in particular the cathode shape and material adds new features to the source:

operation at an even wider range of pressures, operating with reactive gases such as oxygen, operating with unusual gases such as water vapor (for example it might be desirable to include a pre-defined amount of water or its constituents in films), increased plasma output and stability, and higher power and improved cooling.

A configuration according to the invention includes a source of plasma having a hollow enclosure with a gas inlet opening and a gas discharge opening. A cathode surface is exposed to an interior space of the enclosure and an anode surface is located downstream of a constriction element, a gas is fed to the gas inlet opening and plasma is emitted from the discharge opening of the constriction element. The shape of the opening of constriction element can be round or elongated (rectangular). In other configurations the source is liquid cooled and/or the cathode is insulated from the surrounding environment, so that all exterior surfaces of the source are safely at ground potential. The cathode can be a hollow configuration to increase its surface area, and the inlet gas passage can include an inlet orifice to prevent a discharge in the gas feed line. The geometric relationship between the substrate and the source may be fixed or variable during processing.

In another configuration according to the invention, two plasma chambers are constructed in series; the first chamber feeds the second chamber with plasma. This increases the stability and density of the plasma emitted and reduces the probability that a high energy particle will be generated and leave the second chamber through its discharge opening of the constriction element.

The plasma source cells can also be configured in parallel, to provide several plasma streams toward a substrate.

The source can be constructed and operated in a way that the anode is remote from the small discharge opening of the constriction element. This can be done, for instance, by applying the negative potential to the cathode as previously described but keeping the other source parts (such as housing and the other metal parts adjacent to the blocking insulator) electrically floating. The anode can be a separate ring or tube located downstream of the main body of the plasma source. The anode can be attached to the main body (forming a unit) or detached from it. In an extreme case, the substrate, substrate holder, and the chamber wall can function as the anode, and no dedicated anode part is necessary. In all cases, the discharge is constricted to a small area ("discharge opening of the constriction element.") such that a localized voltage drop forms at this flow constriction. The flow of current between the interior cathode and the exterior anode is concentrated at the flow constriction. When the localized voltage drop exceeds or substantially exceeds the gas ionization potential the apparatus and method according to the invention cause plasma production as described above, and the plasma formed at the flow restriction is blown to the substrate by the pressure gradient.

The source can operate with all kinds of gases. Besides nitrogen, we have tested the source running with argon, air, water vapor, and oxygen. The latter is important, for instance, for the deposition of oxide films. Since the source can operate at a high pressure typical for sputter deposition of thin films, plasma-assisted sputter deposition becomes feasible by combining one or several constricted glow discharge plasma sources with magnetron sputtering and laser ablation facilities. This could have great impact on the deposition of oxide films for controlling the passage of sunlight and electrochromic windows and deposition of high temperature superconducting films such as yttrium barium copper oxide. The use of the source configuration according to the invention with oxygen promotes the enhanced incorporation of oxygen in the surface layer, as the concentration of oxygen is usually too low in the original as-deposited films.

A source according to the invention is well suited to produce a nitrogen plasma used for the MBE growth of gallium nitride films on heated substrates such as sapphire and silicon carbide.

Other gasses excited to a plasma state can be used with a source according to the invention.

Operation of the source with an inert gas such as argon at low pressures can be useful for IBAD thin film deposition.

The lifetime of constricted glow discharge plasma sources in a configuration according to the invention is much longer than sources operating with hot filaments. This is generally true but in particular when operating with oxygen, because hot filaments burn easily in oxidizing environments.

A method according to the invention includes the steps of: feeding a gas into a hollow discharge cell, applying a DC voltage to form a plasma in the discharge cell including a small constriction area such as to provide a downstream plasma flow with low energy ions to help synthesize nitride films, such as gallium nitride, on suitable substrates such as AlN, sapphire, and SiC, and to synthesize oxide films such as tungsten oxide films on glass or other substrates, and to synthesize a yttrium barium copper oxide film by exposing such films to an oxygen plasma to obtain an increased concentration of oxygen atoms in the film, and to assist the growth of thin films such as metal films by providing low energy ions such as argon ions.

DETAILED DESCRIPTION

Structures and methods according to the invention include several versions of constricted glow discharge plasma sources. In contrast to Miljevic high energy focused electron and ion (beam) source, the anode is the most downstream electrode and kept at ground potential to generate a flow of low-energy plasma.

Figure 1:
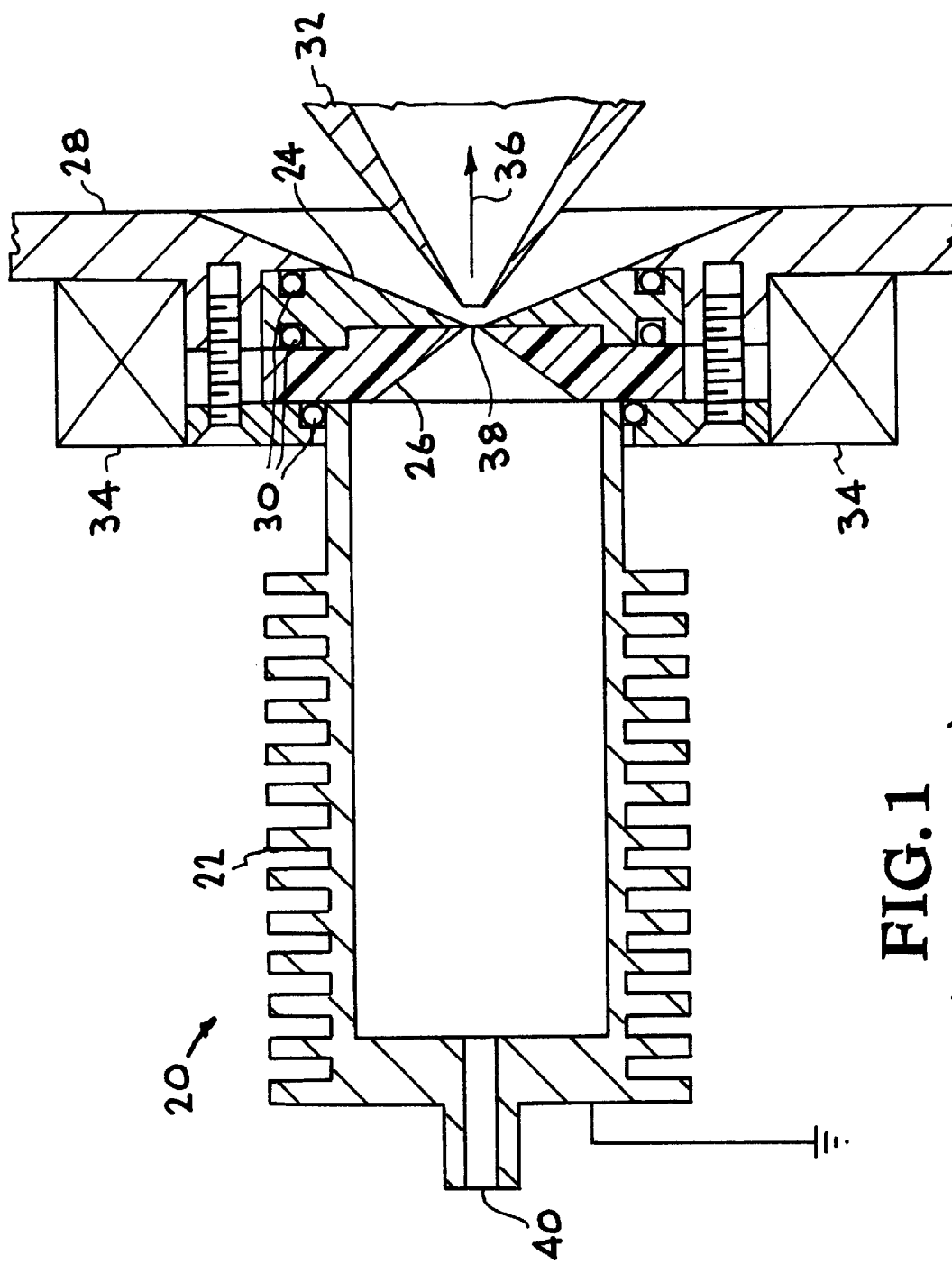
FIG. 1 is a cross sectional schematic view of a prior art hollow-anode ion beam source.
Figure 2:
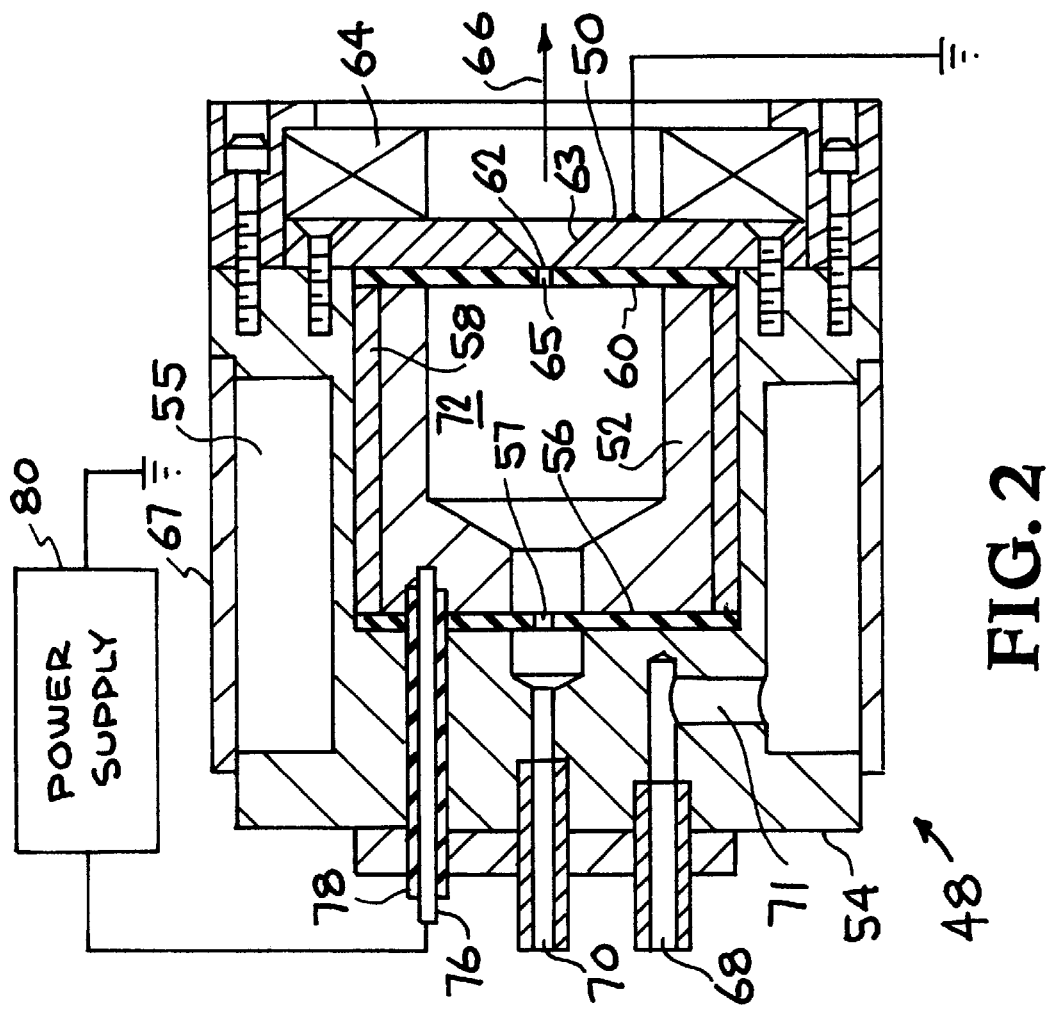
FIG. 2 is a cross sectional schematic view of a constricted glow discharge plasma source with all exterior surfaces at ground potential, in a configuration according to the invention.
Figure 3:
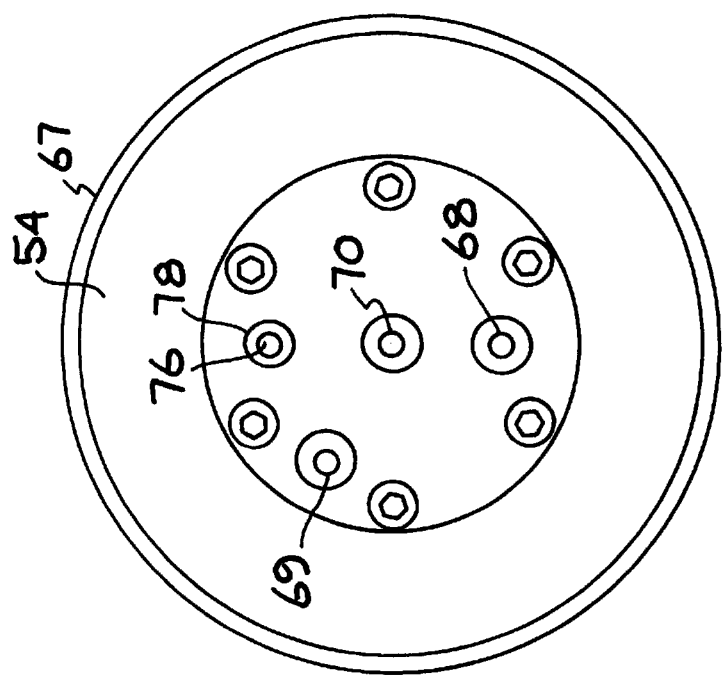
FIG. 3 is an end view of the source as shown in FIG. 2.

As shown in FIGS. 2 and 3 the anode plate 50 is grounded because the substrate (not shown) is usually grounded. This is to avoid creating an electric field between the source and the substrate which would accelerate the ions in the plasma. Having the anode 50 grounded defines one boundary condition of the configuration. Consequently, the cathode 52 has to be negative (a potential less than ground). Therefore the cathode 52 cannot be directly mounted to the chamber or to a holder connected to the chamber because the chamber is always grounded (for safety reasons). The cathode 52 has to be electrically insulated from the surrounding metal parts 50 and 54.

In one configuration the outside surface of the body of source is kept at ground, the same potential as the chamber, so that all kinds of holders and clamps can be attached to the body 54. In the configuration of FIGS. 2 and 3, the source body 54 is grounded and separated from the cathode 52 by a thin ceramic disk 56 (e.g., made of AlN approximately 0.25 mm thick) and by a surrounding cylindrical sleeve 58 (preferably made of stainless steel).

The anode 50 is separated from the edge of the hollow cathode 52 by a ceramic disk 60. The ceramic disk 60 acts as an anode insulating barrier covering all but a small portion of the anode. A discharge opening 62 (0.5–2.0 mm) provides a passage through the disk 60 and is the origin of a low energy plasma stream (not shown).

At the discharge end of the source 48 the anode 50 is bolted to the body 54. A magnetic member 64 can be positioned outside the anode 50. The magnetic member 64 can be an electro-magnet or a permanent magnet. The magnetic field will enhance the plasma production at the discharge opening 62 and reduce the expansion of the plasma as it exits the anode discharge opening 62. The cone 63 of the anode discharge opening 62 form a large angled (90 degree or wider angle) nozzle at the end of the discharge passage 65 through the anode 50. The shorter the discharge passage 65 and the wider the discharge cone 63 the better the plasma production flowing in the direction shown by an arrow 66.

The function of the magnet member 64 here is to magnetically insulate the anode 50 to enhance the voltage drop and electric sheaths thickness located at the constriction opening. This is achieved by using an axial magnetic field, i.e. the magnetic field lines are aligned with the axis of symmetry of the discharge cell.

Figure 5:
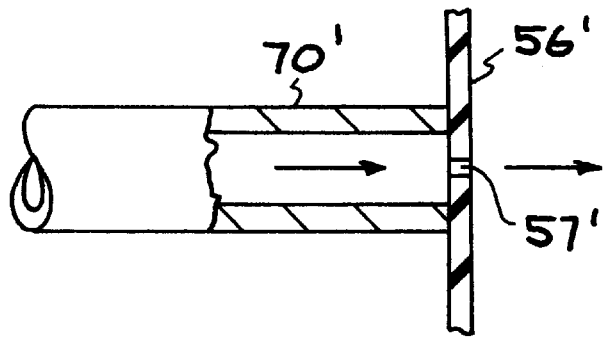
FIG. 5 shows a cross sectional close-up view of the gas feed passage showing an orifice in the passageway into the interior space of the source formed by an insulating ring/disk between the cathode and the member adjacent to it.

The gas inlet tube 70 provides gas to the interior hollow space 72 of the body 54 and the center of the hollow cathode 52. As gas travels through the inlet passage tube 70, a restriction to gas flow is imposed by the hole 57 (0.5–2.0 mm in dia.) in the insulating disk 56. The disk 56 can be configured as shown in FIG. 2, or in an alternate configuration as shown in FIG. 5. In FIG. 5 an inlet tube 70' closely approaches an insulating disk 56' such that an inlet hole 57' acts as an orifice to establish a high pressure on the upstream side to prevent plasma from forming in the inlet tube 70'. According to Paschen's Law, the higher the gas pressure the greater the voltage that will be needed to ionize the gas. The separation of regions of high and low pressure by the orifice 57' assures that ionization will only occur on the low pressure side of the orifice and back burning of the feed passage will thereby be prevented.

Figure 4:
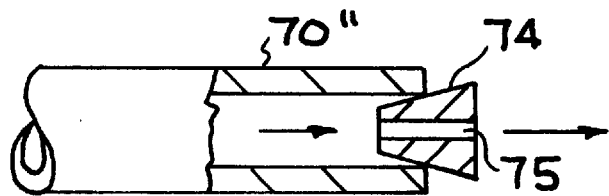
FIG. 4 shows a cross sectional close-up view of the gas feed passage showing an orifice in the passageway into the interior space of the source formed by a plug positioned in the end of the passage.

A similar function is performed by the configuration as shown in FIG. 4. A gas inlet tube 70" is fitted with an orifice plug 74 having an orifice 75 (0.5–2.0 mm in dia.) to create the differential pressure required to prevent back burning. On the high pressure side, electrons collide often elastically with gas molecules and thus cannot gain sufficient energy between collisions to allow them to ionize. Thus, plasma is not formed in the high pressure region. This backburning situation does not occur in the prior art as the polarity there is different.

The inlet end of the source 48 also includes a power supply post 76 connected to the cathode 52 through an insulating sleeve 78. A DC power supply 80 supplies power to the post 76. The source body 54, (preferably made of stainless steel) includes an annular channel 55 enclosed by an annular channel-enclosing cylinder 67. A water inlet tube 68 and a water outlet tube 69 (FIG. 3) circulate water (or other cooling liquid) through the annular channel 55, through a set of water cooling passages (e.g., 71) only one of which can be seen in FIG. 2. The cathode temperature during operation is estimated to be 100 degrees Celsius.

Figure 6:
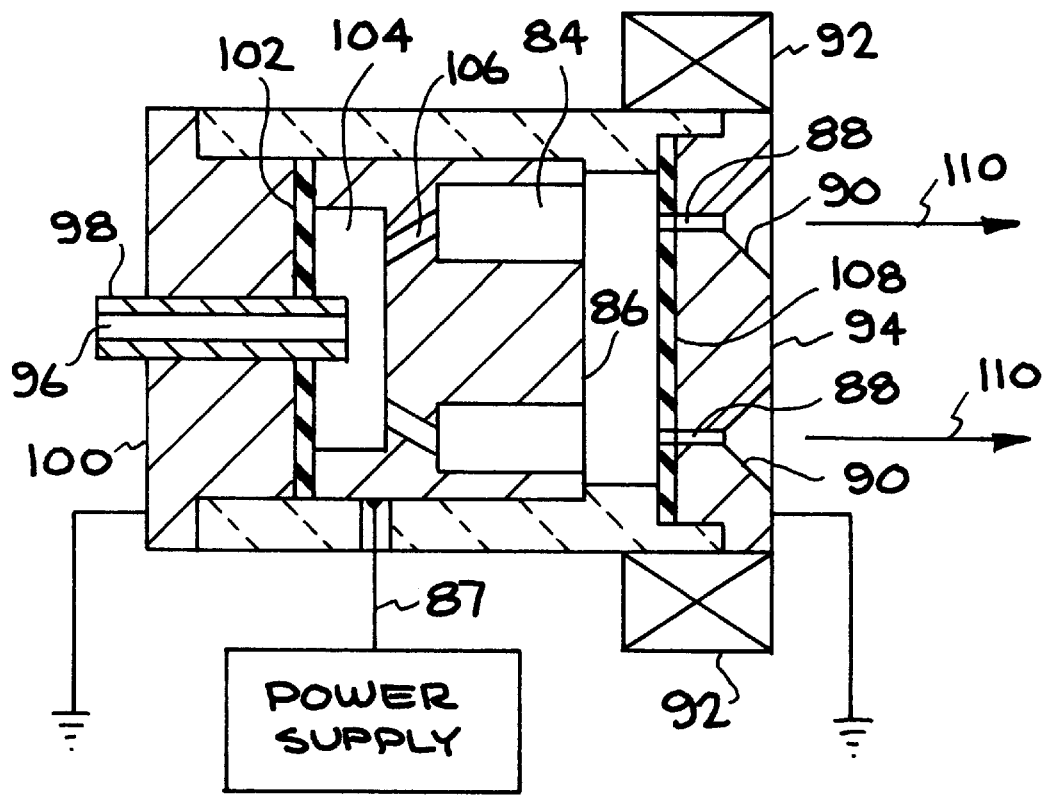
FIG. 6 is a cross sectional schematic view of a constricted glow discharge plasma source with a hollow-cathode with multiple constriction apertures and a magnetic field coil, according to the invention.

FIG. 6 shows a configuration according to the invention having several hollow cathode spaces (e.g., 84) in the cathode 86. Each hollow cathode space (e.g., 84) faces a constriction opening (e.g., 88). As configured in FIG. 6 there are 6 constriction openings generally equally spaced along the circumference of a circle (a seventh constriction opening of the set is configured at the center axis of the cathode and cathode is not shown for clarity). Each constriction opening (e.g., 88) has a discharge cone (e.g., 90). A magnetic member 92 is shown surrounding the outside of an anode 94.

Gas for the plasma is supplied to a gas inlet 96 through a gas inlet tube 98 through a grounded backing member 100 and a ceramic (e.g., AlN or $Al_2O_3$) insulating disk 102 into a cathode inlet plenum 104. From the inlet plenum 104 each hollow cathode space (e.g., 84) is connected to the plenum 104 by its own connection passage (e.g., 106). The hollow space (e.g., 84) increases the surface area of the cathode 86 exposed to the gas flow and subject to the electric field between the cathode 86 and the anode 94. An insulating constriction disk 108 having 6 constriction openings (or 7 if the unillustrated center constriction opening is included) therein matching the location of the constriction openings (e.g., 88) in the anode covers substantially all of the anode 94. Power to the cathode is supplied through a power connection 87. Plasma produced at the location of the passages and constriction openings (e.g., 88) travels in the direction of the arrows (e.g., 110).

Figure 7:
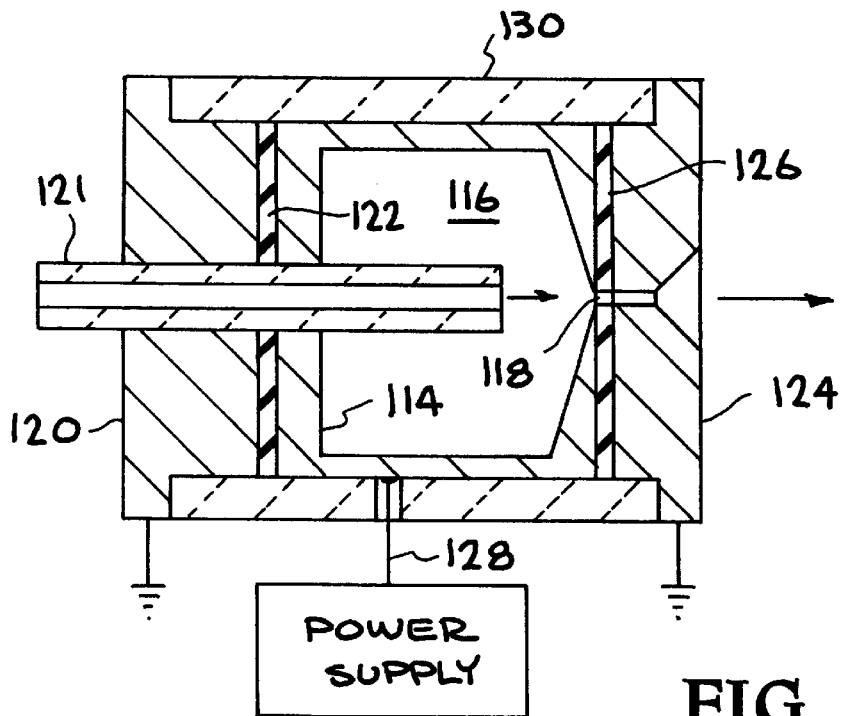
FIG. 7 is a cross sectional schematic view of a constricted glow discharge plasma source with a hollow-cathode with both ends at ground potential, in a configuration according to the invention.

When using a hollow cathode configuration as shown in FIGS. 6 and 7, the source will operate more efficiently and with greater stability (constricted glow discharge plasma source with hollow cathode). The utilization of the hollow-cathode effect (i.e., electrons oscillate in the cathode cavity due to electrostatic reflections from the cathode sheath, and thereby increase the probability of colliding inelastically with gas molecules to create ions as the cavity is repeatedly crossed) significantly increases the generation of plasma over a configuration with a flat faced cathode.

An advantage of using a hollow cathode is that the pressure range in which the source can operate, is widened. Different embodiments have been tested which operate in the very wide range of $9 \times 10^{-6}$ Torr to 0.5 Torr (pressure measured outside the source, i.e. in the vacuum chamber).

FIG. 7 shows a configuration of a hollow cathode 114 for use with a configuration according to the invention. The large cathode area enhances the generation of a plasma so that a plasma can be initiated and supported at lower voltages than if the surface area of the cathode were smaller. The use of a lower voltage reduces the energy of ions generated in the second chamber.

The small diameter (~0.5 to 1.0 mm) of the constriction opening 118, further reduces the probability that high energy ions will leave the source. A ceramic inlet tube 121 supplies gas to the hollow cathode space 116. The gas, in plasma form, is discharged through the discharge hole 118. The hollow cathode 114 is insulated from the back plate 120 by an insulating disk 122 (in this configuration made of a ceramic material). The anode 124 is separated from the hollow cathode 114 by an anode insulating barrier 126, made of a ceramic material approx. 0.25 mm thick and having a hole to match the constriction opening 118 of the source. The surrounding wall 130 is a hollow ceramic cylinder (preferably made of AlN). The hollow cathode 114 is powered by a power supply connection 128.

Figure 8:
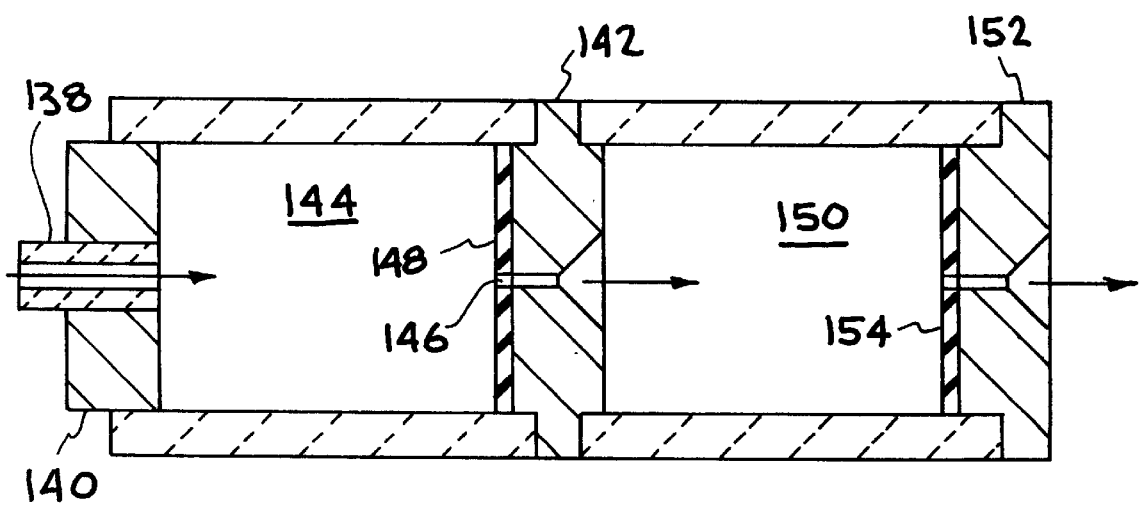
FIG. 8 is a cross sectional schematic view of a constricted glow discharge plasma source in a dual stage configuration according to the invention.

In a constricted glow discharge plasma source configuration as shown in FIG. 8, a second discharge chamber is added to the "single-stage" constricted glow discharge ("dual-stage constricted glow discharge plasma source"). Gas is supplied through a feed passage 138 (here pictured as a ceramic material) to a first chamber 144 through a 1st cathode 140. An electric field is created in the first chamber 144 by the difference in potential between the first cathode 140 and an intermediate anode/cathode electrode 142 which is insulated from the first chamber 144 by a first insulating anode barrier (constriction element) 148 causes the gas injected therein to form a plasma. The first chamber 144 includes an intermediate constriction opening 146 which routes the plasma from the first chamber 144 to the second chamber 150. The electric field in the second chamber 150 (created by the difference in potential between the intermediate anode/cathode electrode 142 and a second anode 152) excites the gas in the second chamber 150 to form a plasma. The second anode 152 is covered by a second insulating constriction opening 154.

In this dual stage configuration, the additional (first) chamber can be any source for a gas discharge (plasma), but a constriction glow discharge chamber is preferred. The discharge chambers are connected in such a way that the gas is first fed to the additional chamber. The plasma from the first discharge chamber (or cell) 144 streams into the main chamber 150 of the constriction glow discharge, driven by a pressure gradient. The purposes of the additional chamber are (1) to inject plasma into the main constriction glow discharge (one may consider the first chamber as a replacement of the filament cathode), (2) to provide a plasma source to initiate the main discharge, and (3) to reduce the anode-cathode voltage drop in the main chamber and reduce the associated cathode sputtering.

The benefit of the two inline chambers is that the downstream chamber (i.e., 150) can burn at a lower voltage because the plasma making is promoted by the plasma streaming in from the first stage. The burning voltage between the cathode 142 and anode 152 in the final stage (e.g., 150) can be smaller than usual, because this discharge is supported by a plasma input stream coming from the first stage (e.g., 144).

There is also a process benefit, if problems are encountered with contamination coming from a sputtered cathode material, caused by the excessive sputtering of the cathode which depends strongly on the magnitude of the energy of the ions hitting the cathode. The magnitude of the energy can be reduced by reducing the burning voltage. When this is done with a single stage source, the plasma production will go down and it will eventually stop completely.

In the two stage configuration it is possible to keep the plasma production alive because plasma is fed to the second chamber (e.g., 150), so the voltage of the final stage 150 can still be reduced and still have enough plasma to provide a reasonable process rate. This configuration provides the benefit of reducing contamination while being easier to operate and having a higher output plasma density.

Figure 9:
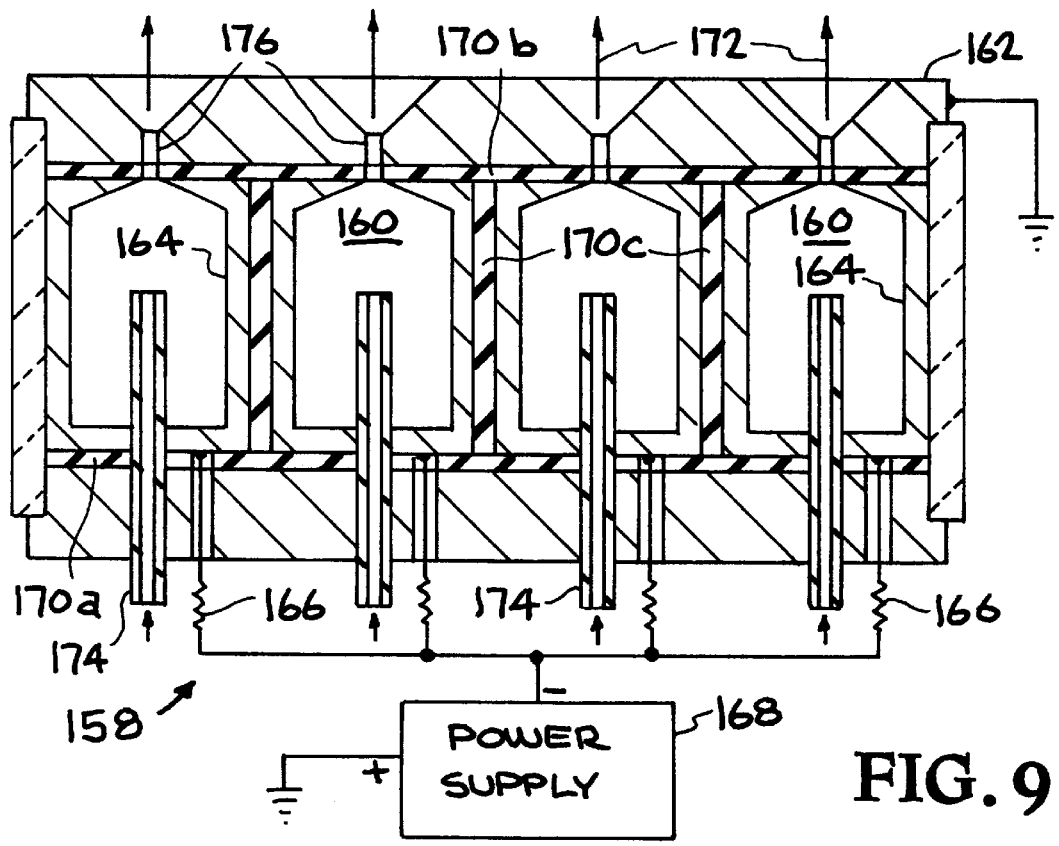
FIG. 9 is a cross sectional schematic view of a quasi-linear, constricted glow discharge plasma source with hollow-cathodes according to the invention.

Constriction glow discharge plasma sources with a hollow cathode can be built as single or dual-stage point sources or as quasi-linear or multiple point sources as shown in FIG. 9.

Most sources are cylindrically shaped. The quasi linear source as shown in FIG. 9 has a rectangular cross section.

Figure 10:
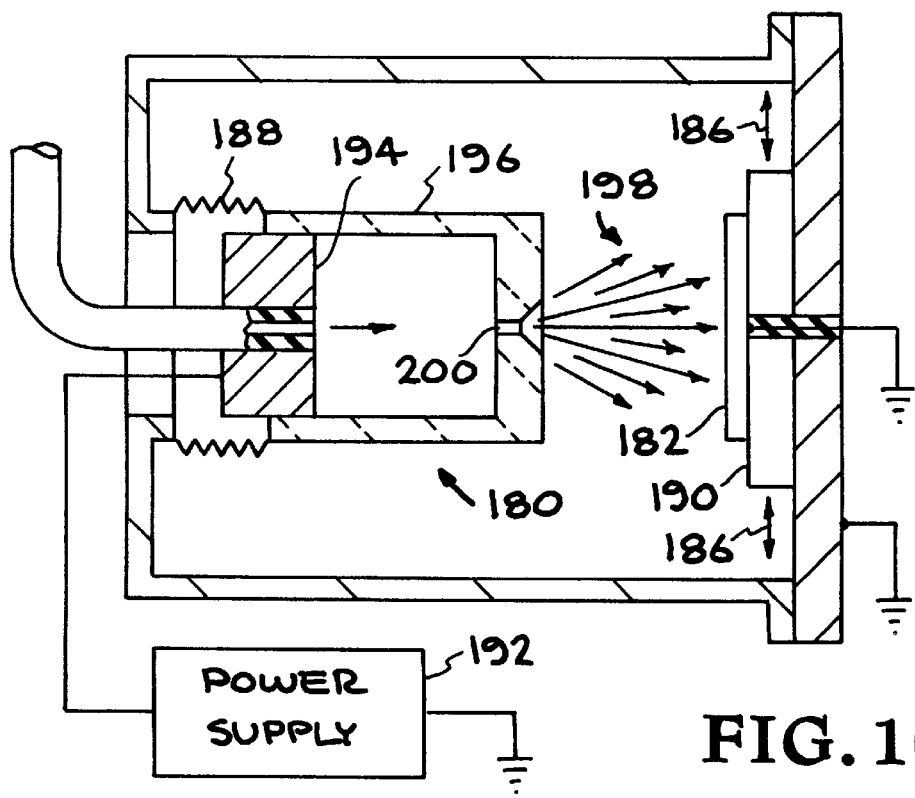
FIG. 10 is a cross sectional schematic view of a constricted glow discharge plasma source where the cathode is inside a gas feed chamber while the anode is outside the enclosure and is connected to the wall of the chamber.

As shown in FIG. 10, the source 180 and substrate 182 can be stationary or can be moved as shown by the arrows 184 during processing to process the full area of the substrate 182 although the source 180 and substrate 182 in a stationary position can deposit on a less than full area of the substrate being processed. It is also possible to scan the plasma flow across the substrate by magnetic field coils (not shown). The distance between the source 180 and the substrate 182 can be adjusted by bellows 188, while the substrate 182 and substrate support 190 include mechanisms (the details of are not shown but are understood by persons of ordinary skill in the art) to move the substrate 182 in a predetermined pattern. In this configuration only the cathode is powered by the power supply 192 and the cathode container 196 is allowed to float while a plasma 198 is allowed to stream from the constriction opening 200 of the container 196 toward the substrate 182 and substrate support 190 which are both grounded, and act as the anode.

While the Figures show the plasma source to be mounted in a horizontal configuration, a vertical or other angled mounting is possible as the effect of gravity on the process, if any, is negligible.

In one configuration, where the growth of gallium nitride is intended, the distance between the source and the substrate is approximately 4 to 5 inches. The pressure in the processing chamber is in the low $10^{-4}$ Torr range, and all gas injected into the processing chamber comes in through the plasma source. The gas is pure nitrogen injected at a flow rate of approximately 5–50 sccm.

The output of the source can be increased by using an axial magnetic field. Experiments show that this is true for sources with a single constriction opening as well as with several openings.

All above described sources can be operated with an external magnetic field which helps to stabilize the discharge and increases the plasma output.

All above described sources can be built in such a way that they are UHV (ultra high vacuum, i.e. residual pressure $10^{-9}$ Torr or less) compatible and made of the materials acceptable to the specific application. This implies, for instance, to avoid plastic materials and O-ring sealing; instead, only UHV metals such as stainless steel, aluminum, and ceramics such as AlN and $Al_2O_3$ are used.

The cathodes of the sources shown in FIGS. 2–10 are indirectly cooled via heat conduction through thin insulating ceramics such as AlN. It is principally possible to implement direct cooling of the cathode by a cooling liquid such as water. This is only necessary for very high power levels. The construction with direct cathode cooling requires the use of electric breaks separating the cathode potential (negative) from ground. Care must also be exercised to keep the gas supply insulated from the power source.

FIG. 9 shows a quasi linear source would be here the design of choice since large area substrates (window glass) are to be treated.

FIG. 9 shows another version of the constricted glow discharge plasma source, a quasi-linear constricted glow discharge plasma source 158. It is characterized by using several individual constricted glow discharge plasma source cells 160 which are closely aligned in a row.

The source can behave even more like a linear source by using constriction openings which are elongated ("slots") along the row.

For convenience a common "quasi linear" anode 162 with individual cathodes (e.g., 164) is used, separated from adjacent cathodes and grounded members by a series of insulators 170*a,b,c*. For stability reasons, each cathode (e.g., 164) has its individual load resistor (e.g., 166), but conveniently a single power supply 168 can be used. The advantage of a "quasi linear" source is that large substrate areas can be homogeneously treated with the outwardly streaming plasma by using a one-dimensional motion of the substrate (perpendicular to the direction of line of the constriction openings). The individual feed lines 174 to each chamber assure equal burning at the discharge of each chamber's constriction opening 176.

Typically the sources described above range from 1.5 to 4 inches in diameter and are about 3 inches in length.

A constricted glow discharge plasma source has been used to form lithium nitride on lithium battery electrodes by nitrogen plasma immersion ion implantation to form a nitrogen-enriched lithium surface.

Where a gallium nitride film is to be grown using a nitrogen gas it is preferred that the substrate be a crystalline material. The crystalline material may be such that it has a lattice constant generally matched to that of the substrate such as SiC and bulk GaN. Or the crystalline material may be such that it has a lattice constant generally not matched with that of the substrate such as sapphire.

Other nitride films might also be synthesized. It may be possible to grow carbon nitrides using the hollow-anode plasma source.

A method according to the invention may include use of the structure and method according to the invention while simultaneously bombarding said substrate with a stream of material for growth of film on the substrate. The source then acts as a low energy ion beam assist to epitaxy deposition. In this configuration the low energy beam reduces the likelihood of defect formation, which higher energy ions have a high probability of producing.

The features described in this disclosure represent a further development of the constricted glow discharge, and combination of the discharge with extractor systems can lead to a variety of ion and electron sources. Another way of obtaining energetic particles (e.g. keV range of energy) is to bias the source or substrate in order to obtain an accelerating electric field; adjustments can also be done by magnetic fields. Thus the source is also applicable to materials synthesis and modification where energetic particles are required.

While the invention has been described with regards to specific embodiments, those skilled in the art will recognize that changes can be made in form and detail without departing from the spirit and scope of the invention.

What is claimed is:

1. A source of plasma comprising:
   a hollow enclosure having a gas inlet opening and a gas discharge constriction passage;
   a cathode surface being exposed to an interior space of said enclosure, wherein said cathode is connected to a DC power supply providing a negative voltage to said cathode;
   an anode surface exposed to said discharge constriction passage, wherein said anode is connected to an electrical ground, where the positive voltage of said DC power supply is connected to said electrical ground, said anode being remote from said discharge constriction passage; and
   a gas source connected to feed gas to said gas inlet opening;
   wherein said gas discharge constriction passage is sized to provide a localized voltage drop between the cathode and anode in the gas flowing through said gas discharge constriction passage at said gas discharge constriction passage so that the flow of current between the cathode and anode is concentrated at the gas discharge constriction passage such that the localized voltage drop exceeds the ionization potential of the flowing gas creating additional plasma which is blown out of said gas discharge constriction passage by a pressure gradient between the inside of the hollow enclosure and a space into which gas flowing from said gas discharge constriction passage discharges.

2. A source of plasma as in claim 1, further comprising;
   a substrate being processed by plasma emitted from said source; wherein an electrical potential of said substrate is substantially at the same level as the potential of said anode.

3. The source of plasma as in claim 1, further comprising:
   a cooling member in thermal contact with a portion of said hollow enclosure, wherein said cooling member is configured with a passage for thermal transfer fluid.

4. The source of plasma as in claim 1, further comprising:
   a support member at ground potential separated from the cathode by an insulating member and preventing and acting as part of an insulating enclosure preventing said cathode from being exposed to the environment around it.

5. The source of plasma as in claim 4, further comprising:
   a movable support member to move a substrate being processed by the source of plasma within a vacuum chamber during processing of said substrate.

6. The source of plasma as in claim 4,
   wherein said support member is linked to a bellows support which moves said hollow enclosure along an axis substantially perpendicular to a surface of a substrate to be processed.

7. The source of plasma as in claim 4,
   wherein said insulating member includes a gas feed hole through the member, the gas inlet opening is routed to the gas feed hole and the gas feed hole acts as a restricting orifice to prevent gas from said gas source from freely passing into said hollow enclosure through said gas inlet opening.

8. The source of plasma as in claim 1, further comprising:
   a movable support member to move a substrate being processed by the source of plasma in a direction lateral to an axis of said discharge constriction passage within a vacuum chamber during processing of said substrate.

9. The source of plasma as in claim 1, further comprising:
   a movable support for the hollow enclosure in a direction along an axis of said discharge constriction passage.

10. The source of plasma as in claim 1, further comprising:
    an inlet orifice in a hollow chamber inlet passage which is a portion of an inlet piping system that conducts gas from said gas source to said gas inlet opening, the inlet orifice creates a pressure differential across the orifice at a process gas flowrate and pressure to prevent plasma formation in said inlet piping system during processing.

11. The source of plasma as in claim 1,
    wherein said localized voltage drop substantially exceeds the gas ionization potential.

12. A source of plasma comprising:
    a hollow enclosure having a gas inlet opening and a gas discharge constriction passage;
    a cathode surface being exposed to an interior space of said enclosure;
    an anode surface exposed to said gas discharge constriction passage
    a gas source connected to feed gas to said gas inlet opening;
    wherein the material of the cathode is such that when it is sputtered with a gas supplied by said gas source, and the cathode material and gas constituents combine to form a film on said cathode surface, said film material is substantially electrically conductive.

13. The source of plasma as in claim 12,
    wherein said gas is oxygen and said material of said cathode is stainless steel.

14. The source of plasma as in claim 12,
    wherein said gas is nitrogen, said material of said cathode is titanium.

15. A source of plasma comprising:
    a vacuum processing chamber having an anode at a ground potential;
    a hollow enclosure within said chamber having a gas inlet opening and a gas discharge constriction passage;
    a surface of a cathode exposed to an interior space of said hollow enclosure energized with a DC bias with respect to said ground potential at said anode; and
    a gas source connected said gas inlet opening, to supply gas to be excited into a plasma;
    wherein said gas discharge constriction passage is an outlet orifice whose outlet opening faces a substrate processing location in said chamber, wherein said anode located outside of said hollow enclosure and said substrate are at approximately the same electrical potential, and said anode is positioned remote from said gas discharge constriction passage so as to cause the plasma emitted from said discharge constriction passage to be directed toward the substrate processing location;

wherein said gas discharge constriction passage is sized to provide a voltage drop between the cathode and anode in the gas flowing through said gas discharge constriction passage at said gas discharge constriction passage so that the flow of current between the cathode and anode is concentrated at the gas discharge constriction passage to produce a plasma which is blown out of said gas discharge constriction passage by a pressure gradient between the inside of the hollow enclosure and a space into which gas flowing from said gas discharge constriction passage discharges.

16. The source of plasma as in claim 15, wherein said cathode is substantially surrounded by insulating members, except on the surface where the cathode is exposed to the interior of said hollow enclosure.

17. The source of plasma as in claim 15, wherein said gas inlet opening includes an inlet orifice to create a substantial pressure differential across said inlet orifice as gas is fed into said hollow enclosure.

18. The source of plasma as in claim 15, wherein said localized voltage drop substantially exceeds the gas ionization potential.

19. A source of plasma comprising:

a hollow enclosure having a gas inlet opening and a gas discharge constriction passage;

a cathode surface being exposed to an interior space of said enclosure;

an anode surface exposed to said gas discharge constriction passage; and a gas source connected to feed gas to said gas inlet opening;

wherein the material of the cathode is such that when it is sputtered with a gas supplied by said gas source, and the cathode material and gas constituents combine to form a film on said cathode surface, said film material is substantially electrically conductive;

wherein said gas discharge constriction passage is sized to provide a localized voltage drop between the cathode and anode in the gas flowing through said gas discharge constriction passage at said gas discharge constriction passage so that the flow of current between the cathode and anode is concentrated at the gas discharge constriction passage such that the localized voltage drop exceeds the ionization potential of the flowing gas creating additional plasma which is blown out of said gas discharge constriction passage by a pressure gradient between the inside of the hollow enclosure and a space into which gas flowing from said gas discharge constriction passage discharges.

20. The source of plasma as in claim 19, wherein said anode is remote from said discharge constriction passage.

* * * * *